United States Patent [19]

Higuchi et al.

[11] 3,866,134

[45] Feb. 11, 1975

[54] POWER AMPLIFIER WITH SELF BIASING AND INSENSITIVITY TO TEMPERATURE VARIATIONS

[75] Inventors: Hobart Atsushi Higuchi; Richard Arnold Voge, both of San Jose, Calif.

[73] Assignee: International Business Machines Corporation, Armonk, N.Y.

[22] Filed: Aug. 9, 1973

[21] Appl. No.: 387,097

[52] U.S. Cl. ........................ 330/22, 330/15, 330/17, 330/19, 330/23, 330/30 D

[51] Int. Cl. ......................... H03f 3/04, H03f 3/68

[58] Field of Search .................. 330/13, 15, 17, 23; 330/19, 22, 30 D

[56] References Cited

UNITED STATES PATENTS 3,617,859 11/1971 Dobkin et al. .................... 330/23 X

OTHER PUBLICATIONS

H. W. Parmer - "Two easy ways to stabilize power-transistor Hi-Fi amplifiers" Electronics, pp 56–58, Oct. 26, 1962

*Primary Examiner*—Rudolph V. Rolinec
*Assistant Examiner*—Lawrence J. Dahl
*Attorney, Agent, or Firm*—Robert W. Keller

[57] ABSTRACT

A power amplifier having means for self biasing an emitter follower output stage over a range of temperatures comprises two matched transistors having the bases thereof directly coupled together such that the base-emitter potentials of the transistors are equal in magnitude and opposite in direction. Consequently, the output current is dependent only upon the value of the input current and resistance and the output resistance. A particular embodiment for this power amplifier utilizes two symmetrical power amplifier circuits that are complementary to one another in a push-pull arrangement.

12 Claims, 5 Drawing Figures

POWER AMPLIFIER WITH SELF BIASING AND INSENSITIVITY TO TEMPERATURE VARIATIONS

BACKGROUND OF THE INVENTION

1. Field of the Invention

The present invention relates to a power amplifier with self biasing, and more particularly to a push-pull complementary pair of power amplifiers that are insensitive to temperature variations.

2. Description of the Prior Art

In designing linear power amplifiers it is desirable to minimize crossover distortion and yet conserve standby power. However, it has been difficult to stabilize the bias current level through the final or output stage power transitor. The difficulty arises since transistor parameters, such as the base-emitter voltage, the current through the collector-base junction and $h_{FE}$, drift as temperature changes. As a consequence of temperature drift the quiescent operating point of the outboard transistors in the circuit changes. These difficulties increase as the environment experiences a large temperature variation.

One technique that has been used to stabilize bias current in power amplifiers is shown in FIG. 1. As illustrated therein an adjustable resistor 10 is utilized in a voltage divider circuit for developing a voltage that is applied to the base of a transistor 11 which in turn biases the bases of an NPN and a PNP transistor which develop the output current. However, the three transistors 11, 12 and 13 which encompass both PNP and NPN type configurations have different thermal characteristics. Accordingly, it is virtually impossible to provide the exact thermal matching in their characteristics. Moreover, the adjustable resistor is relatively expensive and must be manually adjusted periodically to provide the desired DC bias through the output stage devices 12 and 13.

A second prior art power amplifier is illustrated in FIG. 2 and employs diodes 14 and 15 which are designed to have forward voltage drops that are matched to that of the respective output stage transistors 16 and 17. However, problems are encountered in attempting to match the voltage drops of diodes to those of transistors and to achieve the exact thermal coupling therebetween as the environment temperature changes. In addition, this amplifier also requires the periodic manual adjustment of a resistor 18 to provide the desired bias on the output stage transistors.

SUMMARY OF THE INVENTION

In order to ,overcome the above-noted defects in power amplifiers a novel power amplifier is provided that automatically establishes a DC bias through its output stage transistor devices and which is substantially insensitive to temperature variations.

It is an object of this invention to provide a power amplifier comprising a push-pull complementary pair of DC coupled amplifiers in which the output bias current is independent of the output stage transistors and is a function of the relative values of the input and the output resistors.

In accordance with the above objects it is another object to provide a power amplifier that is compatible with base drive bootstrapping in order to obtain the optimum output voltage swing and which provides means for limiting the current of the output transistors thus protecting them from overload conditions.

It is yet another object to provide a power amplifier which when used in class AB operation minimizes crossover distortion and conserves standby power.

The foregoing and other objects, features and advantages of the invention will be apparent from the following more particular description of the preferred embodiment of the invention as illustrated in the accompanying drawing in which:

DESCRIPTION OF THE INVENTION

Figure 1:
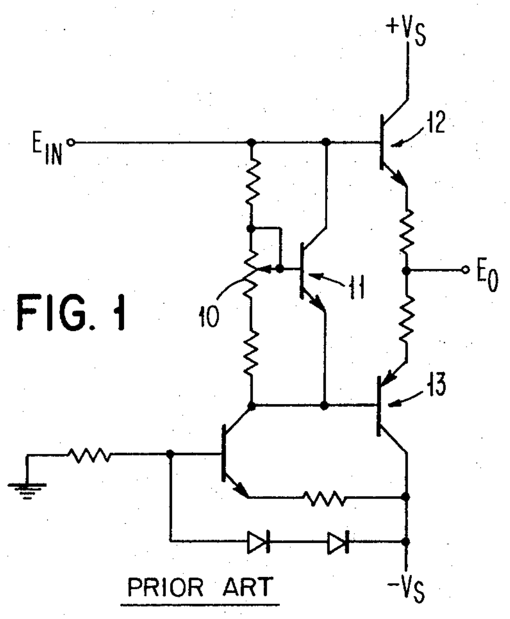
FIG. 1 is a schematic diagram of a prior art power amplifier circuit.
Figure 2:
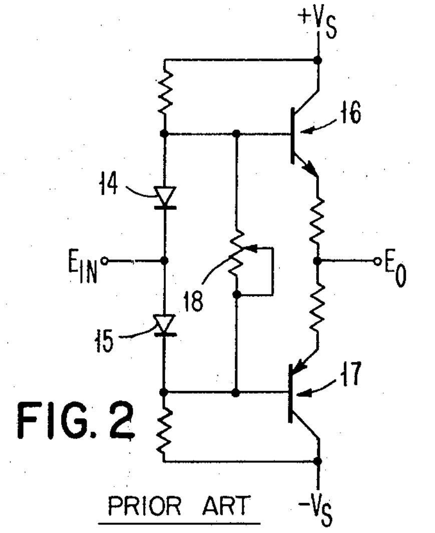
FIG. 2 is a schematic diagram of another prior art circuit.
Figures 3, 4, 5:
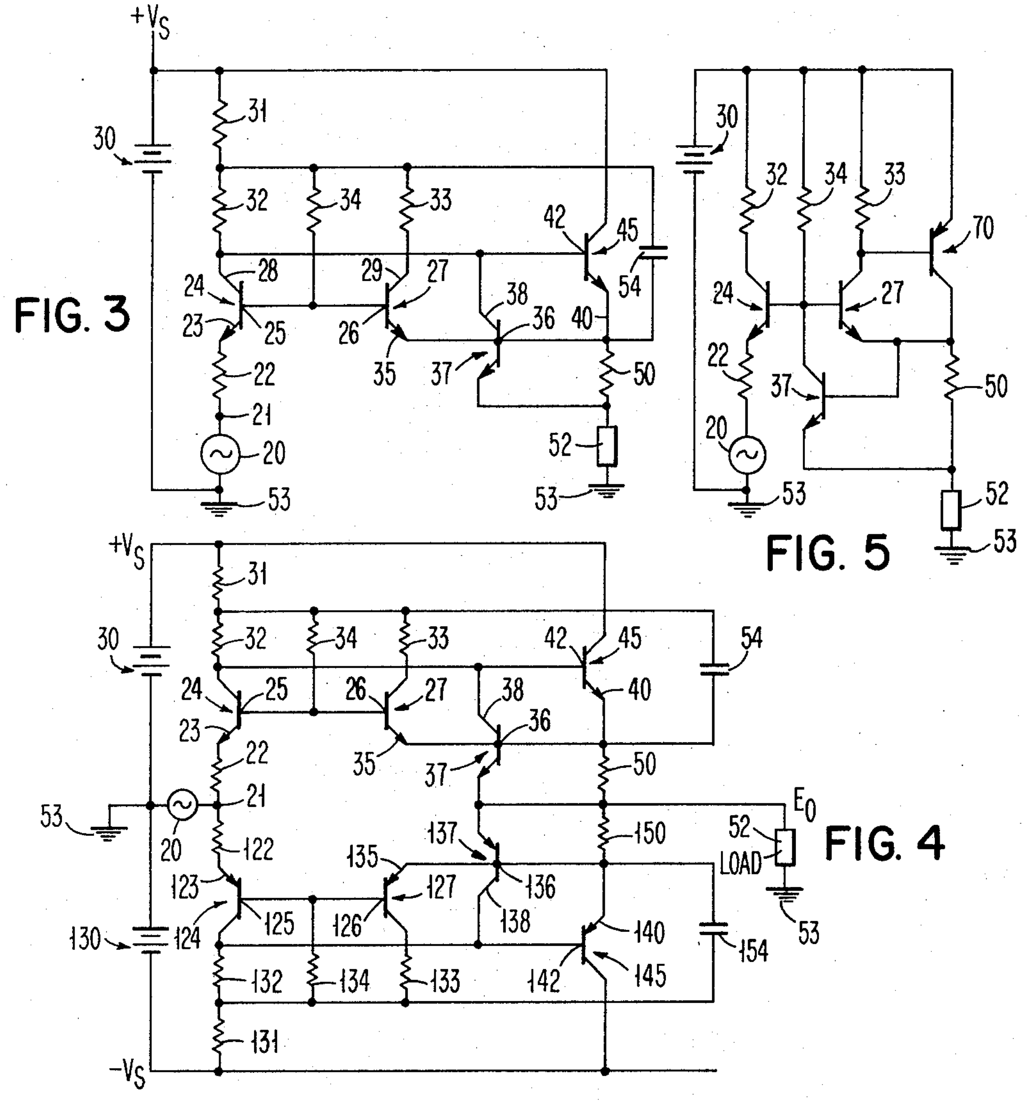
FIG. 3 is a schematic diagram of an illustrative embodiment of a power amplifier circuit constructed in accordance with the principles of the invention.
FIG. 4 is a schematic diagram of an illustrative embodiment of a push-pull complementary power amplifier circuit constructed in accordance with the principles of the invention.
FIG. 5 is a schematic diagram of an alternative embodiment of of circuitry of FIG. 3.

Referring now to the drawings, and more particularly FIG. 3 thereof, there is schematically depicted therein a transistor power amplifier circuit constructed in accordance with the principles of the invention, and suitable for use as a power amplifier in portable stereo equipment and in linear actuator devices. A signal generator 20 is applied at input terminal 21 of the amplifier through a resistor 22 to the emitter 23 of an NPN transistor generally designated by the numeral 24. The base 25 of transistor 24 is directly connected to the base 26 of a second NPN transistor generally designated by the numeral 27. The transistors 24 and 27 are matched such that each has identical parameters including temperature coefficients. A DC potential generated from a battery source 30 is applied through a common resistor 31 and collector resistors 32 and 33 respectively to the collectors 28 and 29 of transistors 24 and 27 respectively. The bases 25 and 26 are commonly biased from source 30 applied through serially connected resistors 31 and 34. The emitter 35 of transistor 27 is connected to the base 36 of a current limiting NPN transistor 37 and to the emitter 40 of an emitter follower NPN outboard transistor generally designated 45. The collector of transistor 45 is connected directly to the positive side of the battery 30 and its base 42 is connected to the collector 38 of transistor 37 and to the collector 28 of transistor 24. Resistor 50 has one terminal connected to the emitters 40 and 35 of transistors 45 and 27 respectively and to base 36 of transistor 37. The other terminal of resistor 50 is connected through a load impedance component 52 to ground 53. A capacitor 54 is tied between resistor 31 and emitter 40 of transistor 45 in a bootstrap arrangement.

In considering the operation of the circuit shown in FIG. 3, matched transistors 24 and 27 and resistors 22, 34 and 50 comprise a self biasing circuit for providing a bias voltage to the base 42 of an output power transistor 45 that is independent of temperature variations. In essence, transistors 24 and 27 comprise a base coupled differential amplifier with the emitter electrodes serving as input terminals and the output signal applied directly from collector terminal 28 to bias base 42 of emitter follower 45. The amount of bias on base 42 determines the quiescent operating point of the emitter follower and consequently its current amplification. A control on the bias level is achieved by feeding back the voltage developed across resistor 50 to the emitter 35 of transistor 27 in the differential amplifier arrangement.

In the preferred embodiment this power amplifier is operated linearly in class AB operation such that none of the transistors are saturated or cut off. Accordingly, the voltages at the emitters of transistors 24, 27 and 45 are equal. Because of this relationship the self biasing of the emitter follower transistor is most significant and will be explained for the case when the input signals voltage 20 equals zero and when the impedance of the load 52 is small with respect to resistor 50.

Because of the matched relationship of transistors 24 and 27 the voltage drops across each base-emitter junction are equal in magnitude for any temperature. Since these junctions are connected back-to-back or in a differential configuration between the input and the output terminals of the power amplifier the base emitter voltages do not affect the operation of the emitter follower output transistors. Thus, the bias applied to the output transistor is insensitive to temperature variations.

Under these conditions the voltage at the emitter 23 of transistor 24 is equal to the product of the value of resistor 22 and the current flowing therethrough. Because of the previously described emitter voltage relationships, the voltage at emitter 35 is equal to the ohmic value of the resistor 50 times the sum of the currents flowing through the emitter 35 of transistor 27 and that flowing through the emitter 40 of transistor 45. Furthermore, resistor 22 is chosen to be much larger than resistor 50 so that the current through the emitter of transistor 45 is much greater than that through transistor 27. Thus, the value of the current flowing through the load 52 out of emitter 40 is approximately equal to the current flowing through emitter 23 of transistor 24 multiplied by the ratio of resistor 22 to resistor 50. The current flowing through the emitter 40 of transistor 45 is designated as the quiescent current through the output transistor. Thus, the output quiescent current as described above is solely dependent upon input and output circuit parameters and is insensitive to temperature changes.

The general operation of the circuit will now be described. As the input voltage from source 20 swings positive transistor 24 begins to turn off which consequently causes its collector voltage at point 28 to rise. This allows current from the constant potential voltage source 30 which passes through resistors 31 and 32 to be applied to bias base 42 of transistor 45, thus tending to turn it on. As transistor 45 turns on current is developed through the resistor 50 causing the voltage thereacross to rise from ground potential 53. Alternatively, if the input voltage swings negative transistor 24 turns on due to the forward bias on base 25 applied through resistor 34. In this condition collector 28 and thus base 42 of transistor 45 are negative, whereby the output transistor is prevented from turning on.

Current limiting transistor 37 provides overload protection for the output transistor 45. If the voltage across resistor 50 increases such that the conduction threshold between base 36 and the emitter of transistor 37 is exceeded then transistor 37 turns on. Once transistor 37 is turned on it diverts base drive current from base 42 thus forcing limited collector current through transistor 45. Hence, the power amplifier output current is limited to a value determined by resistor 50 and the base-emitter voltage of transistor 37. Furthermore, the maximum collector-to-emitter voltage across transistors 24 and 27 is the voltage drop across the base-emitter junction of transistor 45.

In order to obtain an optimum output voltage swing this power amplifier employs a base drive bootstrap circuit comprising resistor 31 and capacitor 54. Since the base current to transistor 45 is developed through resistors 31 and 32 the inclusion of the energy storing capacitor 54 prevents the complete removal of base drive current in the event that transistor 45 were immediately turned on. Capacitor 54 stores charge so long as transistor 45 is nonconducting. Once it begins to conduct the capacitor discharges through resistor 32 to base 42, thus maintaining a bias on the base of transistor 45. The value of capacitor 54 is large enough to provide efficient energy storage at the lowest frequencies for which the circuit is designed.

It has been found that this device is quite useful as a unity gain circuit wherein the output voltage follows the input voltage. Alternatively, gain can be added by preamplifier circuits prior to this amplifier stage or by inserting a voltage divider in the feedback path between emitters 40 and 35.

The basic power amplifier of this invention is advantageously embodied in a push-pull arrangement for providing bidirectional current to a load. This arrangement comprises two complementary basic power amplifiers as illustrated schematically in FIG. 4. It should be noted that the circuit is symmetrical about a line connecting the input and the output terminals. Accordingly, the numerals designating the components in the upper half of the circuit are the same as those in the power amplifiers of FIG. 3 since the components themselves are similar. The components in the lower half of the circuit are complementary to those of the upper half and are designated by reference numerals formed by adding 100 to the numerals of the respective components of FIGS. 3 and 5. In this complementary arrangement the NPN and PNP transistors are interchanged and the bias is developed from a negative voltage source. The operation of this push-pull DC coupled power amplifier is similar to that just described except for the addition of the bottom half of the circuit. The bottom half operates for negative swings of the input voltage in the same manner as the top half did for positive swings since the two circuits are complementary. Accordingly, as the input voltage swings negative transistor 124 shuts off and its collector goes more negative causing transistor 145 to turn on which in turn draws more base current. Thus, current flows from the output terminal or from the load 52 to the negative voltage source 130 through resistor 150, which is opposite to the direction of current flow in the upper power amplifier circuit.

FIG. 5 illustrates an alternative embodiment of this invention in which the output transistor 70 is of a type complementary to those comprising the base coupled differential pair 24 and 27. This circuit does not employ bootstrapping but has the emitter of the PNP transistor 70 and the common terminals of the biasing resistors 32, 33, and 34 directly connected to source 30.

In this embodiment the base of transistor 70 is connected to and driven by the collector of transistor 27 and the collector of transistor 70 is connected to bias resistor 50 and to the emitter of transistor 27 and the base of current limiting transistor 37. The operation of this circuit is similar to that of the circuit described in FIG. 3 except that the collector to emitter voltage across transistors 24 and 27 is no longer limited by the emitter-base potential of the output transistor. This circuit and its complement can be connected in a push-pull configuration similar to that of FIG. 4.

In all embodiments of this invention the bias applied to the bases of the outboard transistors is substantially constant for any temperature changes affecting the base-to-emitter voltage of the transistors 24, 27, 124 and 127. The output transistors can be power transistors connected in a darlington circuit to provide an increase in gain. This amplifier is preferably used in class AB operation such that a low level DC quiescent bias current through the output transistors is established. This allows the output transistors to turn on or off substantially instantaneously thereby to provide a linear output signal when arranged in a push-pull configuration. Accordingly, crossover distortion is minimized and standby power is conserved. Alternatively the amplifier can be used in class B operation and as a consequence of the non-linear characteristics, quiescent current flow would not be required.

This circuit is preferably fabricated by integrated circuit chip technology so as to obtain the desirable characteristics of IC transistors such as matched temperature coefficients, small size, thermal coupling and low voltage requirements.

From the foregoing, it will be understood that the invention provides a novel and simple power amplifier which is particularly useful in push-pull operation. This circuit is insensitive to temperature changes which would ordinarily cause a drift in circuit parameters thus changing the quiescent operating point on the output emitter followers. In class AB operation high linearity in the output signal is achieved, thus eliminating crossover distortion.

While there has been described what are, at present, considered to be the preferred embodiments of the invention, it will be understood that various modifications may be made therein, and it is intended to cover in the appended claims all such modifications as fall within the true spirit and scope of the invention.

What is claimed is:

1. An electric signal amplifying circuit arrangement operable independently of variation in ambient temperature, comprising:

signal input terminals, signal output terminals, an output transistor having base, emitter and collector electrodes, an input transistor and a compensating transistor having base-emitter potential characteristics matched over a range of temperature through which the amplifying circuit arrangement is operable, said input and compensating transistors each having base emitter and collector electrodes, a bias resistor connected between one of said signal input terminals and said emitter electrode of said input transistor, load resistors individually connected between said collector electrode of said input and said compensating transistors and a source of energizing potential, an electric current carrying element connected between said base electrode of said output transistor and one of said load resistors at the terminal remote from said source of energizing potential, the emitter and collector electrodes of said output transistor and a biasing resistor being connected in series between one of said signal output terminals and one terminal of said source of energizing potential an electric current carrying element connected between said biasing resistor at the terminal thereof remote from emitter electrode of said compensating transistor, a bias circuit resistor having one terminal connected in common to said base electrodes of said input and compensating transistors and the other terminal connected to said source of energizing potential, whereby the effect of temperature change on the current applied to a load element connected to said output terminals is compensated.

2. An electric signal amplifying circuit arrangement as defined in claim 1 and wherein the electrode of said output transistor connected to the biasing resistor is the emitter electrode.

3. An electric signal amplifying circuit arrangement as defined in claim 1 and wherein the electrode of said output transistor connected to the biasing resistor is the collector electrode.

4. An electric signal amplifying circuit arrangement as defined in claim 1 and wherein said bias resistor has a value of resistance greater than the resistance value of said biasing resistor.

5. An electric signal amplifying circuit arrangement as defined in claim 1 and wherein the current flowing in said biasing resistor is equal to the product of the current flowing in said bias resistor and the ratio of the value of said bias resistor to that of said biasing resistor.

6. An electric signal amplifying circuit arrangement as defined in claim 1 and incorporating a current limiting transistor having a base electrode connected to the terminal of said biasing resistor connected to one electrode of said output transistor, an emitter electrode connected to the terminal of said biasing resistor remote from the electrodes of said output transistor, and a collector electrode connected to the base electrode of one of said transistors.

7. An electric signal amplifying circuit arrangement as defined in claim 1 and incorporating a resistance element interposed between said source of energizing potential and said load resistor, and a capacitor having one terminal connected to the junction of said resistance element and said load resistor and having the other terminal connected to the emitter electrode of said output transistor.

8. An electric signal amplifying circuit arrangement as defined in claim 7 and wherein said capacitor has a relatively large capacity in order to provide efficient storage at the lowest frequency to be translated by said amplifying circuit.

9. An electric signal amplifying circuit arrangement operable independently of variation in ambient temperature comprising a pair of signal input terminals at which said electric signal is applied, a pair of signal output terminals across which a load impedance element is connected and with one of the signal output connected in common with one of said signal input terminals, a differential amplifier circuit having one input terminal, a complementary input terminal and an output terminal, an output amplifier circuit having an input terminal connected to said output terminal of said differential amplifier circuit, and having an output terminal, a resistor connected between said output terminal of said output amplifier circuit and the other of said signal output terminals, an electric current carrying element connected between said other signal output terminal and said complementary input terminal of said differential amplifier, and a resistance element connected between said one input terminal of said differential amplifier and the other of said signal input terminals, said differential amplifier comprising two transistors having base-emitter potential characteristics matched over a range of temperature through which the amplifying circuit is operable.

10. An electric signal amplifying circuit arrangement as defined in claim 9 and wherein said resistance element has a value of resistance much greater than that of said resistor.

11. A push-pull electric signal amplifying circuit arrangement operable independently of variation in ambient temperature comprising a pair of signal input terminals with one signal input terminal connected as a point of fixed reference potential, a pair of signal output terminals across which a load impedance element is connected with one signal output terminal connected to said point of fixed reference potential, a source of energizing potential having a positive terminal, a negative terminal and an intermediate terminal connected to said point of fixed reference potential, a pair of electric signal amplifying circuit arrangements of the same electric circuit configuration but having transistors of complementary types, each of said electric signal amplifying circuit arrangements comprising, a differential amplifier circuit having one input terminal, a complementary input terminal and an output terminal, an output amplifier circuit having an input terminal connected to said output terminal of said differential amplifier circuit, and having an output terminal, and a resistor connected between said output terminal of each of said output amplifier circuits and the other of said signal output terminals, an electric current carrying element connected between said other signal output terminal and said complementary input terminal of each of said differential amplifier circuits, and a resistance element connected between said one input terminal of each of said differential amplifier circuits and the other of said signal input terminals, said differential amplifier circuits each comprising two transistors having base-emitter potential characteristics matched over a range of temperature through which the amplifying circuit is operable.

12. An electric signal amplifying circuit arrangement as defined in claim 11 and wherein said resistance element has a value of resistance much greater than that of said resistor.

* * * * *